US005455203A

United States Patent [19]

Koseki et al.

[11] Patent Number: 5,455,203

[45] Date of Patent: Oct. 3, 1995

[54] METHOD OF ADJUSTING THE PRESSURE DETECTION VALUE OF SEMICONDUCTOR PRESSURE SWITCHES

[75] Inventors: Osamu Koseki; Yoshifumi Yoshida, both of Tokyo, Japan

[73] Assignee: Seiko Instruments Inc., Japan

[21] Appl. No.: 16,767

[22] Filed: Feb. 11, 1993

[30] Foreign Application Priority Data

| | | | |
|---|---|---|---|
| Feb. 20, 1992 | [JP] | Japan | 4-033598 |
| Oct. 28, 1992 | [JP] | Japan | 4-290186 |

[51] Int. Cl.$^{6}$ .......... H01L 21/465

[52] U.S. Cl. .......... 437/228; 437/901; 148/DIG. 93

[58] Field of Search .......... 437/901, 907, 437/908, 228; 148/91–93; 73/715–718, 726

[56] References Cited

U.S. PATENT DOCUMENTS

| | | | |
|---|---|---|---|
| 4,622,856 | 11/1986 | Binder et al. | 73/727 |

FOREIGN PATENT DOCUMENTS

| | | | |
|---|---|---|---|
| 62-72177 | 4/1989 | Japan | 437/901 |
| 1-286470 | 11/1989 | Japan | 437/901 |
| 2-33974 | 2/1990 | Japan | 437/901 |

*Primary Examiner*—Olik Chaudhuri
*Assistant Examiner*—H. Jey Tsai
*Attorney, Agent, or Firm*—Adams & Wilks

[57] ABSTRACT

A method of adjusting a semiconductor pressure switch of the type having a silicon substrate having a pressure receiving diaphragm includes mounting and pressurizing the semiconductor pressure switch in a pressure chamber and measuring the pressure of the switch to determine if the pressure is above or below the predetermined pressure detection value. If the measured pressure is above the predetermined pressure detection value, the thickness of the diaphragm is adjusted by thinning the diaphragm to adjust the measured pressure to the predetermined pressure detection value. If the measured pressure is below the predetermined pressure detection value, the thickness of the diaphragm is adjusted by thickenning the diaphragm to adjust the measured pressure to the predetermined pressure detection value.

14 Claims, 9 Drawing Sheets

PRIOR ART
FIG. 5A
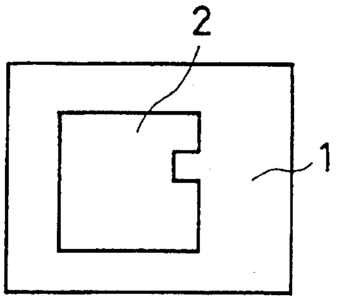
FIG. 5B
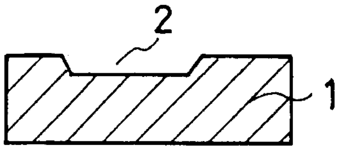
FIG. 5C
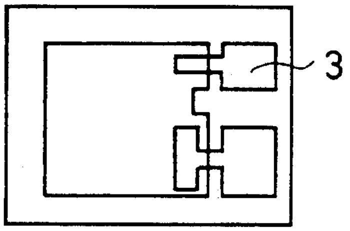
FIG. 5D
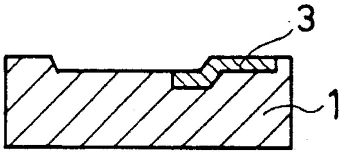
FIG. 5E
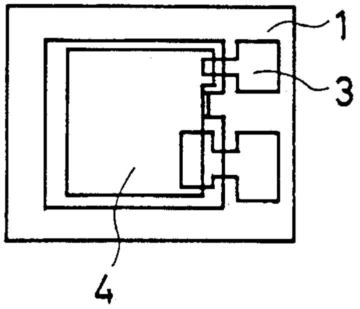
FIG. 5F
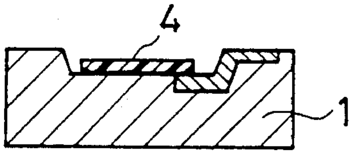
PRIOR ART
FIG. 6A
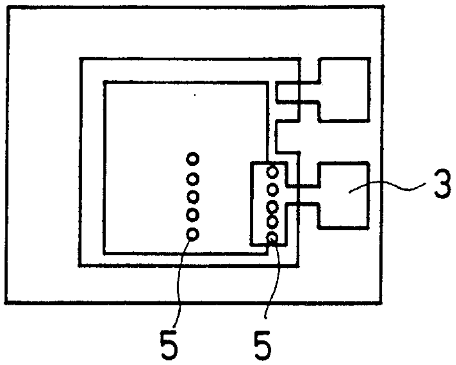
FIG. 6B
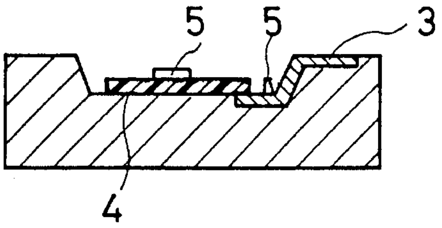
FIG. 6C
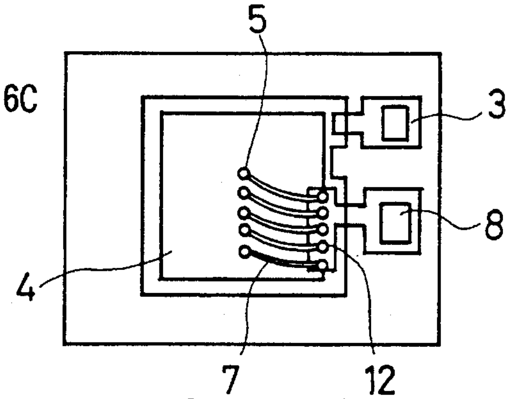
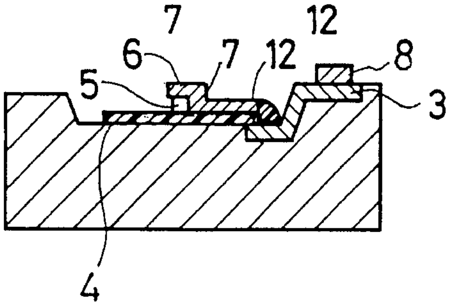
FIG. 6D

METHOD OF ADJUSTING THE PRESSURE DETECTION VALUE OF SEMICONDUCTOR PRESSURE SWITCHES

BACKGROUND OF THE INVENTION

1. Field of the Invention

The present invention relates to an adjusting method and device for semiconductor pressure switches.

2. Description of the Related Art

Manufacturing methods for conventional semiconductor pressure switches will be explained referring to the flowcharts shown in FIGS. 3(*a*) to 3(*l*) and FIGS. 4(*a*) to 4(*d*).

First, a photoresist layer is coated on the surface of a 525 μm thick, N-type silicon substrate 1, which is subjected to a light exposure process, developed, and then patterned so as to remove a portion of the photoresist layer resulting in a recessed portion 2 (refer to FIG. 3(*a*)). After the photoresist patterning process, the silicon substrate 1 is placed in a plasma etching system. A mixture of $CF_4$ and $O_2$ is introduced in the system, and by applying a high frequency of about 70 W, the silicon substrate 1 is etched selectively to form a recessed portion 2 with a depth of about 3 μm (refer to FIG. 3(*b*)). After the formation of the recessed portion 2, a photoresist layer is re-coated on the surface of said silicon substrate 1, and the photoresist layer is exposed to light and developed. The portion of the photoresist layer where a boron-doped electrode 3 is to be formed is patterned by removing. Next, a boron-doped electrode 3 is formed by ion-implanting boron atoms in the system (FIGS. 3(*c*) and 3(*d*). After the boron-doped electrode formation, an oxide film 4 acting as an insulating film is formed and then patterned selectively to leave said oxide film in said recessed portion 2 (refer to FIGS. 3(*e*) and 3(*f*)). Successively, a polycrystalline silicon film 5 is formed on the upper surface of said oxide film 4 using an LPCVD process. The film 5 is selectively etched using a mixture of a hydrofluoric acid and a nitric acid so as to leave the polycrystalline silicon film 5 at a portion where a contact electrode 6 is formed (refer to FIGS. 3(*g*), 3(*h*) and 3(*i*)).

Next, in order to form a contact electrode 6, a wiring electrode 7, and a bonding pad 8, Au and Cr films are formed sequentially on the oxide film 4 and the boron electrode 3 using sputtering. Then, the Au and Cr are etched selectively to form the contact electrode 6, the wiring electrode 7, and the bonding pad 8 (FIGS. 3(*i*) and (*j*)). Au and Cr are then sputtered on a surface of a glass substrate 9 and patterned to form a reference electrode 10 (refer to FIGS. 3(*k*) and 3(*l*)).

Next, the glass substrate 9 and the silicon substrate 1 are aligned so as to face the contact electrode 6 with the reference electrode 10 as shown in FIG. 4(*a*). The structure is then placed on a heater 15 (FIG. 2). Thereafter, the structure is heated at about 400° C. while the silicon substrate 1 and the glass substrate 9 are anodic-welded to each other by applying 0 V to the glass substrate and about 500 V to the silicon substrate 1 for about 20 minutes (refer to 4(*a*)). After the anodic welding, a silicon nitride film 14 is formed on the back surface of the silicon substrate 1 being the opposite side with respect to the welded surface of the glass substrate 9. The silicon nitride film 4 is then patterned selectively using a phosphoric acid at 150° C. to form a diaphragm 11 in the silicon substrate 1 (refer to FIG. 4(*b*)). Furthermore, an alkali-proof coating material 16 is coated on the bonding pad 8 overlaying the silicon substrate 1 and the silicon substrate 1 is then immersed into a potassium hydroxide solution at 90° C. for about 3.5 hours. As a result, the silicon substrate 1 is etched back to about 500 μm to form a diaphragm 11 of 22 μm thick (FIG. 4(*c*). A desired pressure switch is then produced by removing the coating material 16 (FIG. 4(*d*)).

Next, another conventional semiconductor pressure switch manufacturing method will be explained referring to flowcharts shown in FIGS. 5, 6 and 7.

First, a photoresist layer is coated on the surface of a 525 μm thick, N-type silicon substrate 1 which is subjected to a light exposure process, is developed, and then is patterned to form a recessed portion 2. After the photoresist patterning process, the silicon substrate 1 is placed in a plasma etching system. A mixture of $CF_4$ and $O_2$ is introduced in the system and by applying a high frequency of about 70 W the silicon substrate 1 is etched selectively to form the recessed portion 2 with a depth of about 3 μm (refer to FIG. 5(*a*) and 5(*b*)).

After the formation of the recessed portion 2, a photoresist layer is coated on the surface of the silicon substrate 1 which is exposed, developed and patterned before forming a boron electrode 3. Then, a boron electrode 3 is formed by ion-implanting boron atoms in the system (FIGS. 5(*c*) and 5(*d*)). After the formation of the boron electrode 3, an oxide film 4 acting as an insulating film is formed and then patterned selectively so that the oxide film remains in the recessed portion 2 (refer to FIGS. 5(*e*) and 5(*f*)).

Successively, a polycrystalline silicon film 5 is formed using an LPCVD process. The film 5 is selectively etched using a mixture of a hydrofluoric acid and a nitric acid so as to leave the polycrystalline silicon film 5 on a portion of the oxide film 4 and a portion of the boron electrode 3 where a contact electrode 6 is formed (refer to FIGS. 6(*a*), 6(*b*) and 6(*c*)).

Next, in order to from a contact electrode 6, a wiring electrode 7, and a bonding pad 8, Au and Cr films are formed sequentially on the oxide film 4 and the boron electrode 3 using sputtering. Then Au and Cr are etched selectively to form plural contact electrodes 6, plural wiring electrodes 7, plural fuses 12 connecting the wiring electrodes to the boron electrodes, and a bonding pad 8. (FIGS. 6(*c*) and (*d*)).

Au and Cr are then sputtered on a surface of a glass substrate 9 and patterned to form a reference electrode 10 (refer to FIGS. 7(*a*) and 7(*b*)).

Next, the glass substrate 9 and the silicon substrate 1 are arranged on a heater 15 so as to face the contact electrode 6 with the reference electrode 10 (FIG. 7(*c*)). The structure is heated at about 400° C. while the silicon substrate 1 and the glass substrate 9 are anodic-welded to each other by applying 0 V to the glass substrate 9 and about 500 V to the silicon substrate 1 for about 20 minutes. After the anodic welding, a silicon nitride film 14 is formed on the back surface of the silicon substrate 1 being the opposite side with respect to the welded surface of the glass substrate 9. The silicon nitride film 4 is then patterned selectively using a phosphoric acid at 150° C. to form a diaphragm 11 on the silicon substrate 1 (FIG. 7(*d*)).

Furthermore, an alkali-resistant coating material 16 is coated on the bonding pad 8 formed on the silicon substrate 1 and immersed into a potassium hydroxide solution at 90° C. for about 3.5 hours to etch the silicon substrate 1 to about 500 μm to form a diaphragm 11 of 22 μm thick (FIG. 7(*e*)). A pressure switch is then formed by removing the coating material 16 (FIG. 7(*f*)).

Successively, in order to perform switching at a desired pressure switching, the manufactured switch is arranged in a pressure chamber 13 and then pressurized at a pressure of 1.95 kg/cm$^2$ which is below a desired pressure of 2 kg/cm$^2$. A voltage of about 5 V is applied to the pressure chamber 13 hermetically sealed by way of lead wires (FIG. 7(*g*)). A pressure switch which can operate at a desired pressure is manufactured by destroying some fuses 12 which are in contact with the contact electrodes 6 under a pressure of below 1.95 kg/cm$^2$ and by contacting the remaining contact electrodes 6 at a pressure of more than 2 kg/cm$^2$ (refer to FIG. 7(*h*)).

However, according to the conventional manufacturing method, it is difficult for the semiconductor pressure switch to perform a switching operation at a desired pressure because of the variations in the etching depth of the recessed portion, the height of the contact electrode formed within the recessed portion, and the thickness of the diaphragm, thus resulting in larger switching error to pressure and bad manufacturing yield.

According to the conventional fuse trimming art, although it is possible to manufacture a pressure switch which can operate somehow under a desired pressure when an accuracy rating within about ±0.1 kg/cm$^2$ is necessary, the spacing between adjacent individual contact electrodes must be less than 2 μm if the spacing of the neighboring contact electrodes is trimmed for a pressure accuracy of 0.1 kg/cm$^2$. Therefore, the contact electrode has to be less than 1 μm at maximum in size which makes it impossible to form the contact electrode in the 3 μm recessed portion. Hence, there has been a problem of difficulty in achieving good pressure accuracy.

SUMMARY OF THE INVENTION

In order to overcome the above mentioned problems, an object of the present invention is to provide a method of adjusting a semiconductor switch to a desired pressure detection value.

Another object of the present invention is to provide a semiconductor pressure switch having a properly adjusted pressure detection value.

In order to overcome the above mentioned problems, according to the present invention, the thickness of a diaphragm itself is controlled by re-etching the diaphragm of a pressure switch which has been once evaluated under pressure, or by forming a polycrystalline silicon film on the diaphragm. For instance, when the diaphragm thickness is controlled by irradiating a laser beam against the diaphragm, in which a pressure switch is arranged inside a pressure chamber, the diaphragm is etched by irradiating a laser beam against the back surface of the diaphragm while a prescribed pressure is applied to the pressure switch, whereby the pressure switch is adjusted to its detection pressure by etching the diaphragm. The structure includes a pressure chamber and a control unit which detects the pressure switch adjusted to a prescribed detection pressure by means of a laser beam introduced into a pressure chamber and ceases the laser beam output from a laser beam oscillator.

BRIEF DESCRIPTION OF THE DRAWINGS

FIGS. 5A to 5F are explanatory Views showing stages of a conventional semiconductor pressure switch manufacturing method;

FIGS. 6A to 6D are explanatory views showing stages of a conventional semiconductor pressure switch manufacturing method;

DESCRIPTION OF THE PREFERRED EMBODIMENTS

Figure 1A:
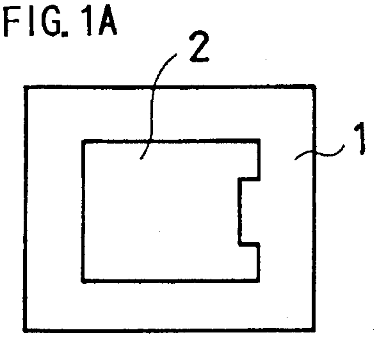
FIGS. 1A to 1L are explanatory views showing stages of a semiconductor pressure switch manufacturing method according to the present invention.
Figure 1B:
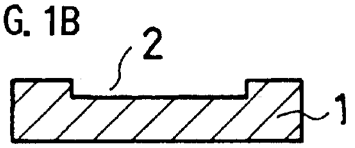
Figure 1C:
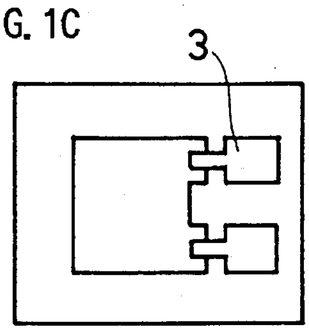
Figure 1D:
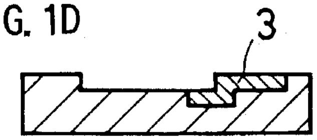
Figure 1E:
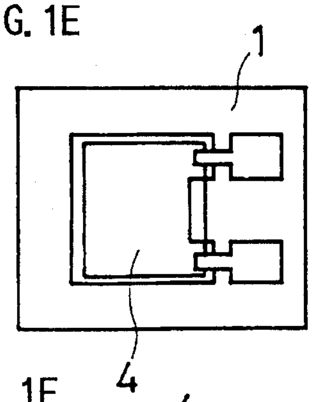
Figure 1F:
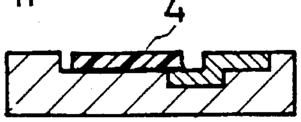
Figure 1G:
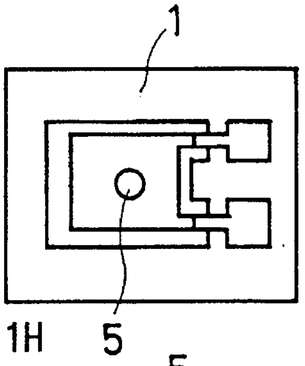
Figure 1H:
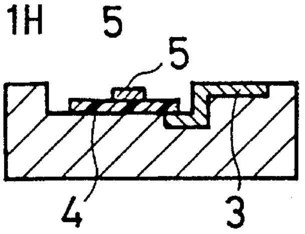
Figure 1I:
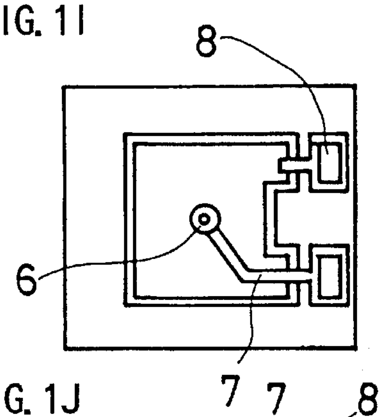
Figure 1J:
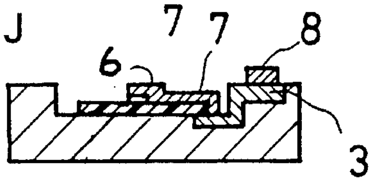
Figure 1K:
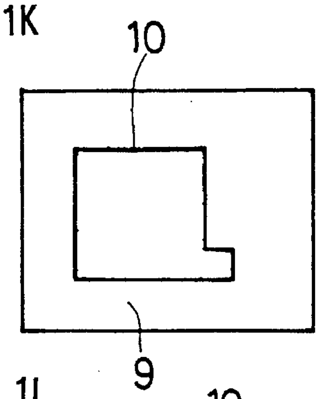
Figure 1L:
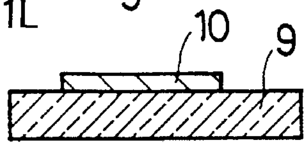
Figure 2A:
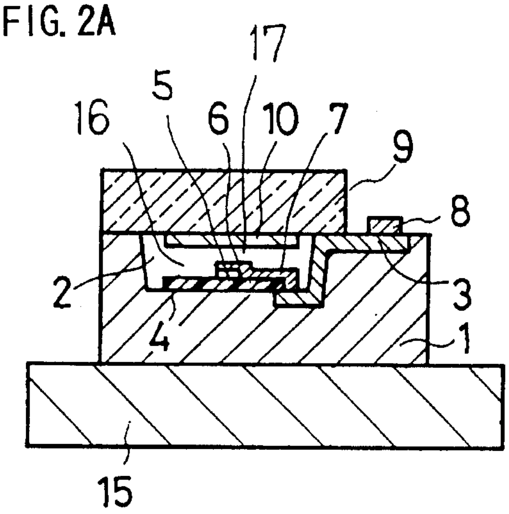
FIGS. 2A to 2F are explanatory views showing stages of another semiconductor pressure switch manufacturing method according to the present invention.
Figure 2D:
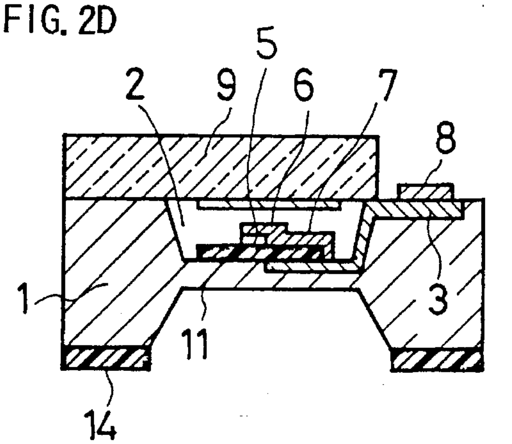
Figure 2E:
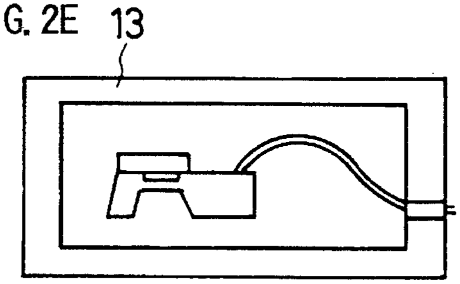
Figure 2B:
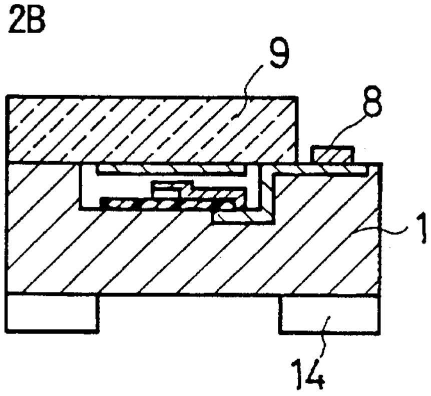
Figure 2F:
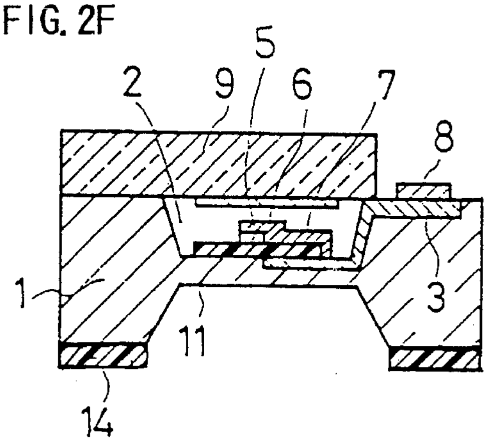
Figure 2C:
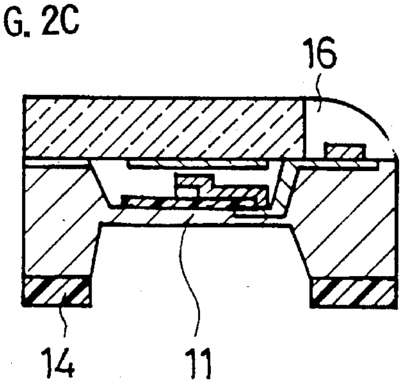
Figure 3A:
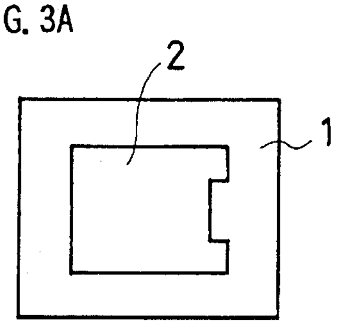
PRIOR ART FIG. 3A
FIGS. 3A to 3L are explanatory views showing stages of a conventional semiconductor pressure switch manufacturing method.
Figure 3B:
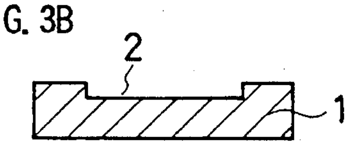
Figure 3C:
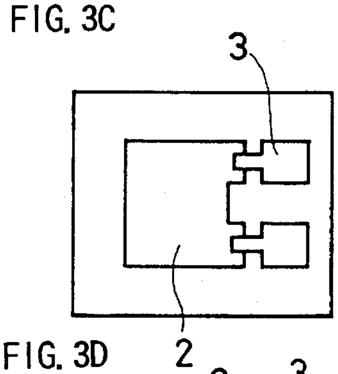
Figure 3D:
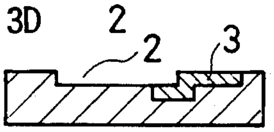
Figure 3E:
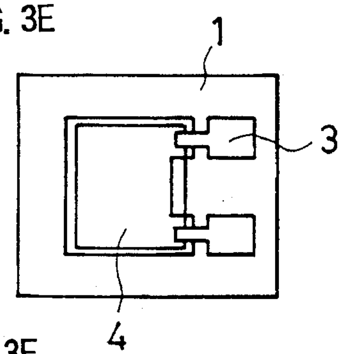
Figure 3F:
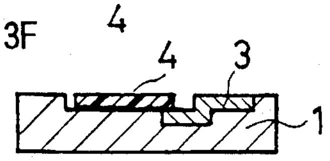
Figure 3G:
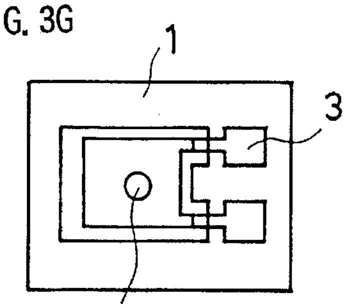
Figure 3H:
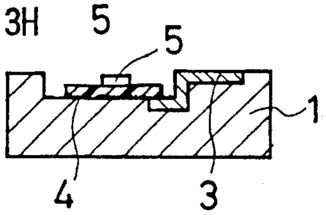
Figure 3I:
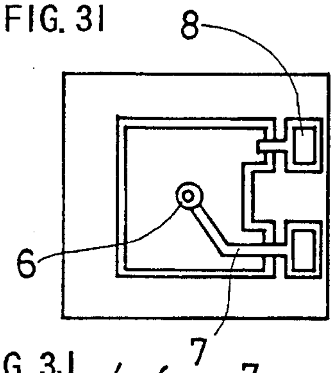
Figure 3J:
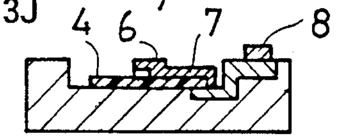
Figure 3K:
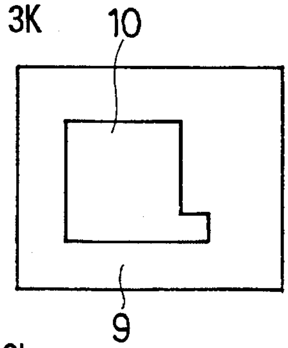
Figure 3L:
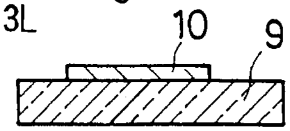
Figure 4A:
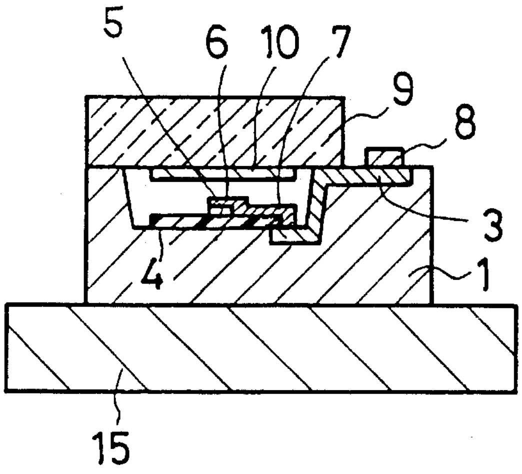
PRIOR ART FIG. 4A
FIGS. 4A to 4D are explanatory views showing stages of a conventional semiconductor pressure switch manufacturing method.
Figure 4D:
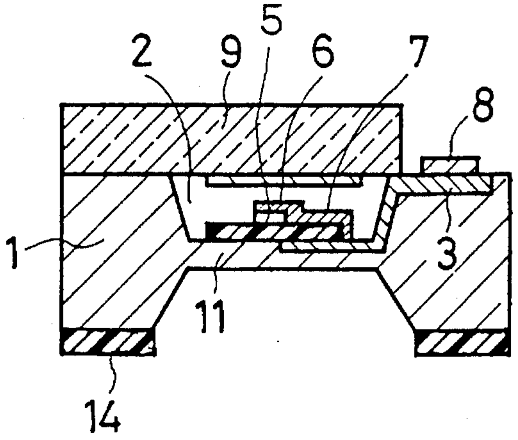
Figure 4B:
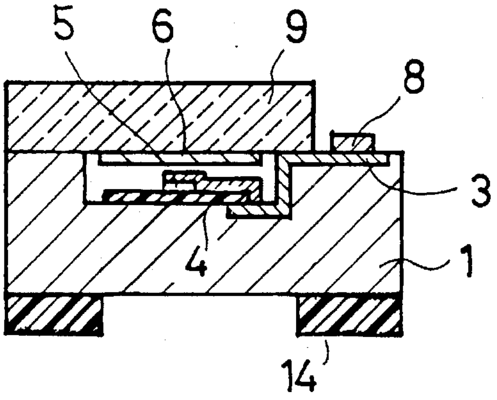
Figure 4C:
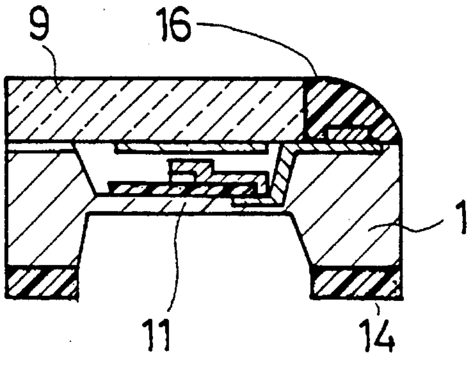
Figure 7A:
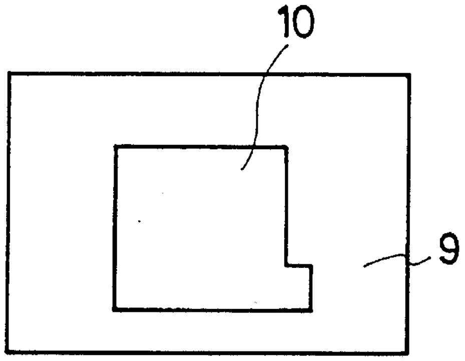
PRIOR ART FIG. 7A
FIGS. 7A to 7H are explanatory views showing stages of a conventional semiconductor pressure switch manufacturing method.
Figure 7E:
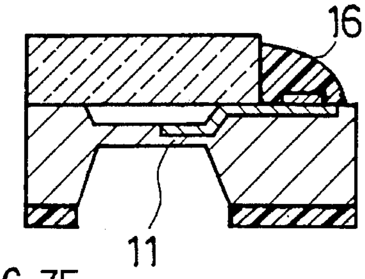
Figure 7F:
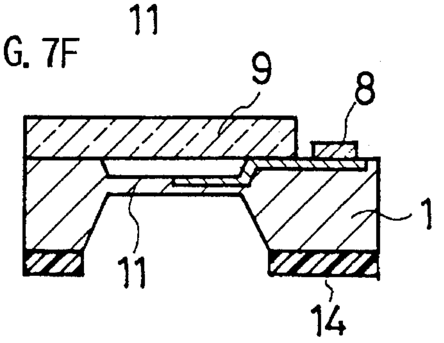
Figure 7B:
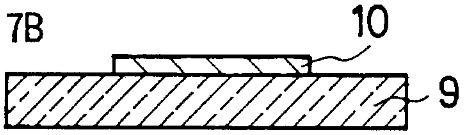
Figure 7C:
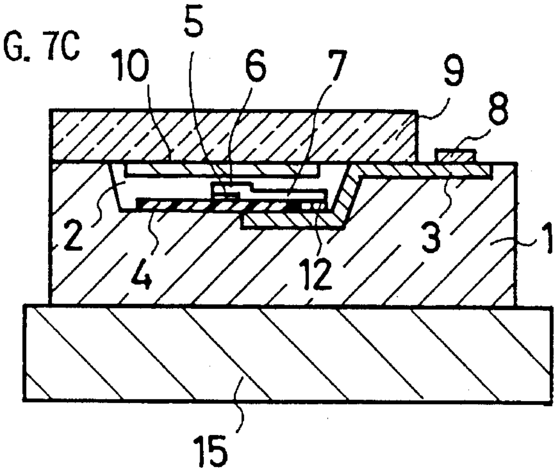
Figure 7G:
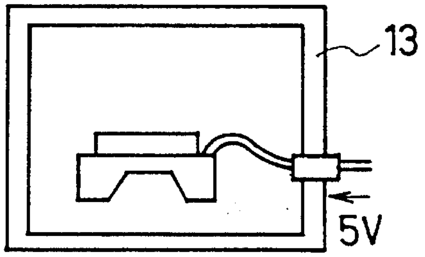
Figure 7D:
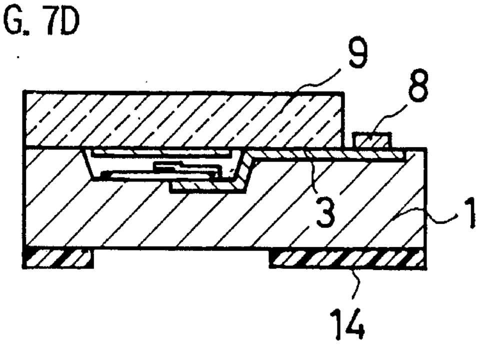
Figure 7H:
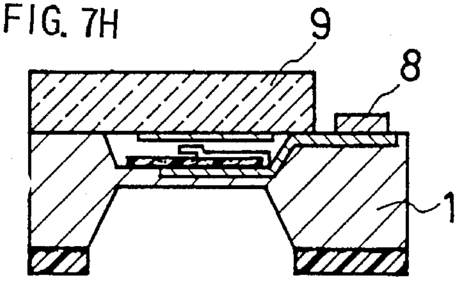

The semiconductor pressure switch manufacturing method of the present invention will be explained according to the explanatory views shown in FIGS. 1 and 2.

First, a photoresist layer is coated on an upper surface of a 525 μm thick, N-type silicon substrate 1 which is subjected to light exposure, developed, and then patterned by removing the photoresist layer on the portion on which a recessed portion 2 is to be formed. After the photoresist patterning process, the silicon substrate 1 is placed in a plasma etching system. A mixture of $CF_4$ and $O_2$ is introduced in the system and by applying a high frequency of about 70 W the silicon substrate 1 is etched selectively to form a recessed portion 2 with a depth of 3 μm (refer to FIGS. 1(*a*) and 1(*b*)).

After the formation of the recessed portion 2, a photoresist layer is coated again on the entire surface of the silicon substrate 1, exposed, and developed. Then patterning is performed so as to remove the photoresist from a portion where a boron electrode is to be formed. Next, a boron electrode 3 is formed by ion-implanting boron atoms (FIGS. 1(*c*) and 1(*d*)). After the formation of the boron electrode 3, an oxide film 4 acting as an insulating film is formed and then patterned selectively so that the oxide film remains in the recessed portion 2 (refer to FIGS. 1(*e*) and 1(*f*)).

Successively, a polycrystalline silicon film 5 is formed in the recessed portion 2 using an LPCVD process. The film 5 is selectively etched using a mixture of hydrofluoric acid and nitric acid so as to leave partially the polycrystalline silicon 5 (refer to FIGS. 1(*g*) and 1(*h*)).

Next, in order to form a contact electrode 6, a wiring electrode 7, and a bonding pad 8, Au and Cr films are formed sequentially on the oxide film 4, the polycrystalline silicon 5, and the boron electrode 3 by sputtering. Then Au and Cr are etched to form a plurality of contact electrodes 6, a plurality of wiring electrodes which double as a fuse, and a wiring electrode 7, and bonding pads 8. (FIG. 1(*i*) and 1(*j*)).

Next, Au and Cr are sputtered on one surface of a glass substrate 9 or support substrate and then patterned to form a reference electrode 10 (refer to FIGS. 1(*k*) and 1(*l*)).

Next, the glass substrate 9 is aligned with the silicon substrate 1 so as to face the reference electrode 10 on the glass substrate 9 with the contact electrode 6 on the silicon substrate 1. The alignment forms a pressure cavity 16, with the reference electrode 10 and contact electrode 6 being separated by a predetermined space 17. The structure is placed on a heater 15 to heat at about 400° C. while the silicon substrate 1 and the glass substrate 9 are hermetically sealed to each other by anodic-welding where 0 V is applied to the glass substrate 9 and about 500 V are applied to the silicon substrate 1 for about 20 minutes (FIG. 2(*a*)). After completing the anodic welding, a silicon nitride film 14 is formed on the lower surface of the silicon substrate 1 being the opposite side with respect to the welded surface of the glass substrate 9. The silicon nitride film 14 is patterned in the form of diaphragm using a phosphoric acid at 150° C. (refer to FIG. 2(*b*)). Next, an alkali-resistant coating material 16 is coated on the portion corresponding to the bonding pad 8 formed on the silicon substrate 1. The silicon substrate 1 is then immersed in a potassium hydroxide solution (KOH) at 90° C. for about 3.5 hours so as to etch the silicon substrate 1 to about 500 μm to form a diaphragm 11 of about 22 μm thick (FIG. 2(*c*)). Then the coating material 16 is removed (FIG. 2(*d*)).

Successively, the manufactured pressure switch is pressurized in a pressure chamber 13 and the pressure under which it switches is measured (FIG. 2(*e*)). When the measured pressure result is higher than a predetermined or desired pressure, the diaphragm is subsequently etched to be further thinned by re-immersing it in the KOH aqueous solution, in order to obtain the desired pressure. For instance, in order to manufacture a pressure switch of a desired pressure of 2 $kg/cm^2$, if its original pressure is 2.3 $kg/cm^2$, the diaphragm is immersed in a KOH aqueous solution for about 15 seconds, thus being adjusted to operate at 2 $kg/cm^2$.

In the subsequent etching process, when a plasma etching system is used etching of 0.5 μm is possible in about 2 minutes, whereby the similar response pressure adjustment can be achieved. On the other hand, if the measured pressure is lower than a desired pressure value, the diaphragm is thickened by forming polycrystalline silicon film on it, whereby the desired higher pressure can be obtained. For instance, when the first measurement indicates a pressure of 1.9 $kg/cm^2$, a polycrystalline silicon film is formed to 0.2 μm thick, whereby the switching characteristic is adjusted to 2 $kg/cm^2$ (FIG. 2(*f*)).

Figure 8:
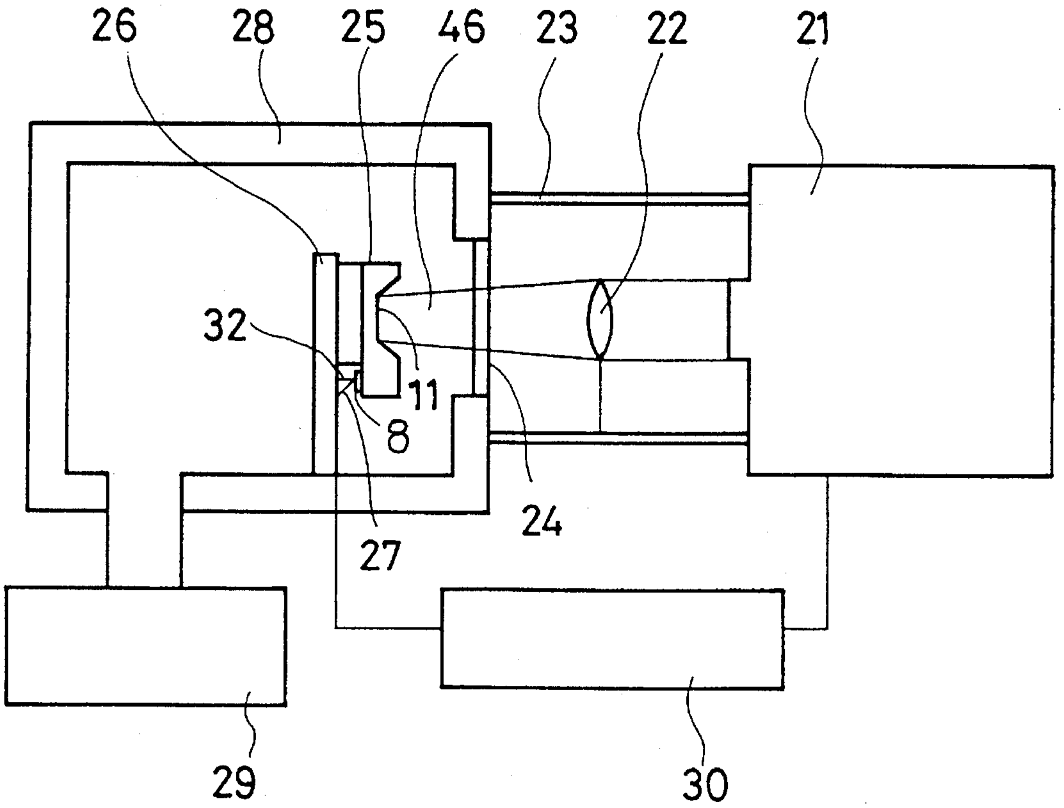
FIG. 8 is a constructional diagram showing a laser type adjusting device according to the present invention.

FIG. 8 is a structural diagram of a laser-type pressure adjusting system according to the present invention. For instance, the laser beam is produced from an excimer laser and its output is 2 W. The laser beam 46 outputted from a laser beam oscillator 21 irradiates onto the upper surface of the diaphragm 11 of a pressure switch 25 through the lens 22 and the window 24 arranged in the light guiding path 23. At this time, the laser beam can be .focused to a spot diameter corresponding to the size of the diaphragm 11 by varying the position of the lens 22. In the pressure chamber 28, the pressurizing (or depressurizing) device 29 adds a desired pressure corresponding to a desired detection pressure. The control unit 30 controls the output of the laser beam 46, using an on/off signal from the pressure switch 25 which operates in response to the pressure in the pressurizing (or depressurizing) device 29.

Figure 9:
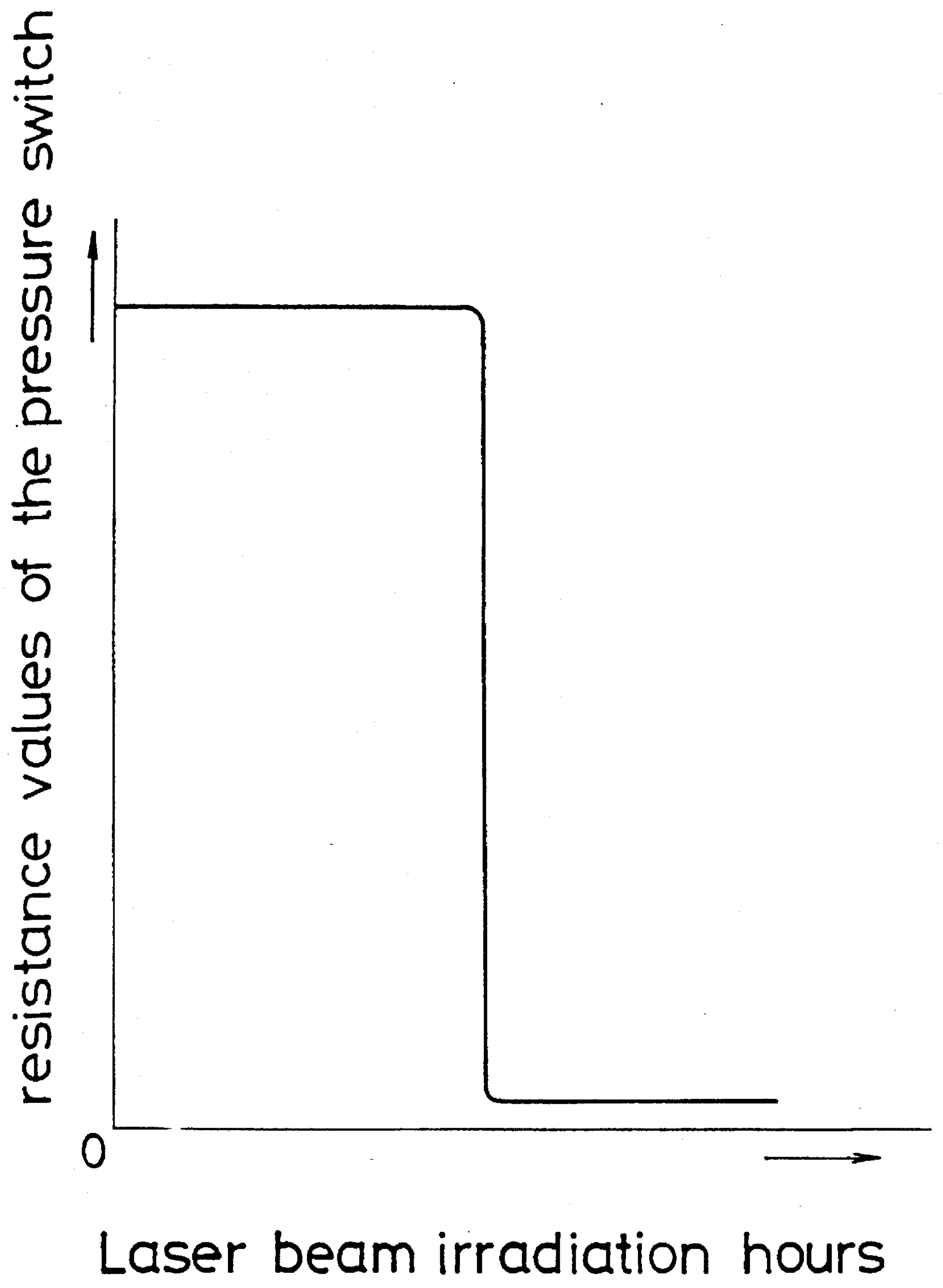
FIG. 9 is a diagram for explaining the relationships between laser beam irradiation hours to diaphragm portion and the resistance values of the pressure switch.

FIG. 9 shows the relationships of the laser beam irradiating hours against the diaphragm 11 to the resistance value of the pressure switch 25. This graph also shows that when the diaphragm of a pressure switch set in the pressure chamber is irradiated by the laser beam, and the diaphragm is thinned by being etched, the pressure switch is turned on, thus resulting in a sudden fall in its resistance. In this case, the pressure switch 25 is applied previously with a voltage, in order that a current flows when the resistance decreases. The current is taken into the control unit 30 shown in FIG. 8 as a signal from the pressure switch 25.

In the actuating pressure adjusting method, if thickness of the diaphragm 11 is larger than a predetermined or desired value, the pressure switch 25 is mounted on the pedestal 26 while a probe 27 is kept abutting against the pad 8 of the pressure switch 25. Next, the pressure chamber 28 is set to a detection pressure value of the pressure switch 25. In this state, a laser beam 46 is irradiated to the diaphragm portion to etch the diaphragm 11. In this case, the laser beam 46 is focused to a desired spot diameter by moving the lens 22 to avoid irradiating the laser beam to any other places than the diaphragm. Due to the above, the diaphragm 11 is thinned by being etched and when the pressure switch 25 is turned on, a signal is inputted to the control unit 30 to cease the irradiation of the laser beam 46. According to this method, since the etching can be performed while the operation of the pressure switch is monitored, it is unnecessary to measure repeatedly the pressure at every etching step. As a result, there is no disadvantage in that the diaphragm is over-etched from a desired thickness. This method also can adjust the detection pressure in units of 0.001 $kg/cm^2$ by properly controlling the output of the laser beam 46.

Figure 10:
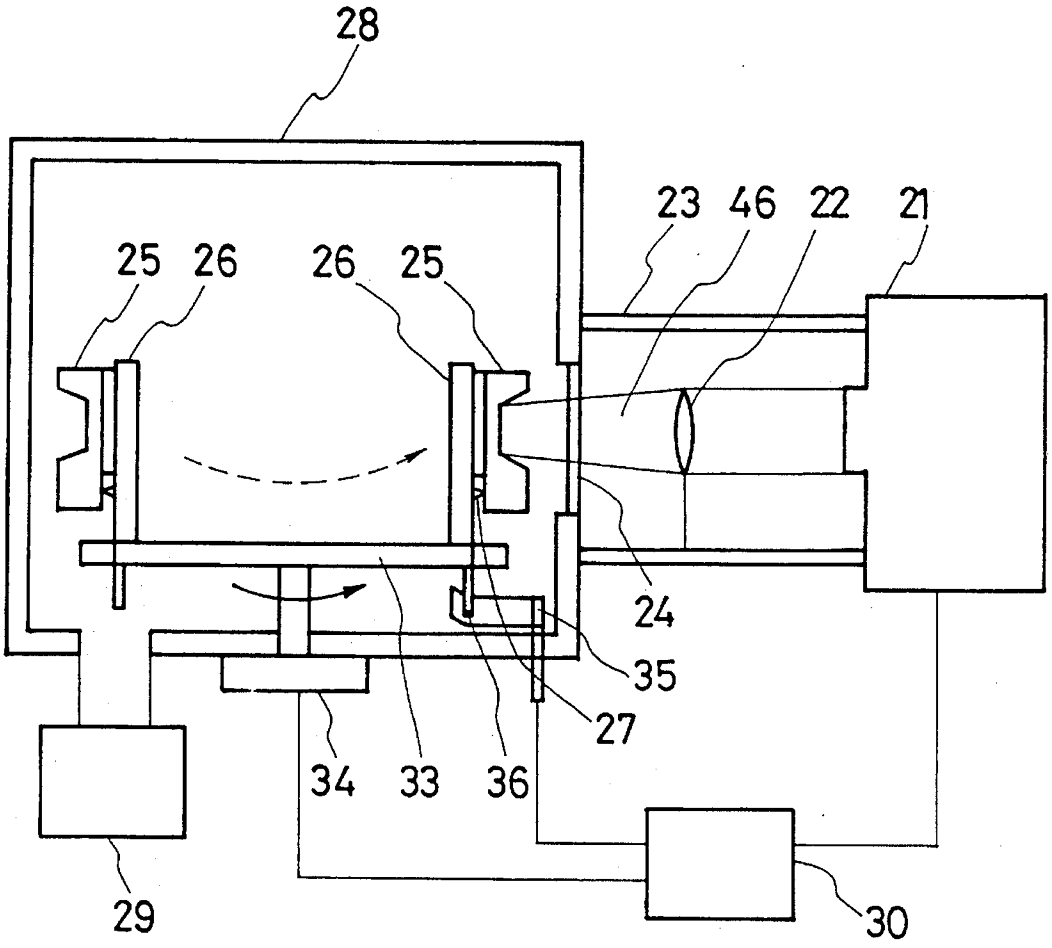
FIG. 10 is a diagram for explaining the construction of an adjusting device with a rotary stage, according to the present invention.

FIG. 10 is another embodiment according to the present invention and shows an adjusting system having a stage which is equipped with a rotary mechanism for moving the pressure switch 25 at the laser beam irradiating portion in the pressure chamber 28. The basic structure is similar to the adjusting system shown in FIG. 8. In this embodiment, the pressure switch 25 is arranged at a circumferential portion of the rotary stage 33 so that the diaphragm thereof faces in the outer direction from the center of the rotary stage. In this case, a plurality of the pressure switches 25 can be arranged at equal intervals on the circumference of the rotary stage 33. The rotary stage 33 can intermittently and sequentially rotate by means of a motor after an etching completion of one sample switch 25 to another. The detected signal from the pressure switch is taken out by contacting the contact 36 extending from the probe 27 abutting against the pad portion 8 of the pressure switch 25 to the spring electrode 35 arranged under the rotary stage 33.

The spring electrode 35, when the pressure switch 25 is set to a prescribed etching position, is arranged at a position where it contacts the contact 36 arranged correspondingly to the pedestal 26 of the rotary stage 33. Furthermore, the spring electrode 35 is connected to the control unit 30 to be applied previously with a voltage and, when the pressure switch 25 is in an on state, a detection signal from the pressure switch under adjustment is sent to the control unit through the probe 27, the contact 36, and the spring electrode 35.

In the present adjustment method, the pressure switches are first fixed such that a respective probe 27 of each pedestal 26 on the rotary stage 33 is in contact with the pad 8. Next, by rotating the rotary stage 33 via the motor 34, the diaphragm 11 of each pressure switch 25 is moved to the etching position. At this point, the contact 36 of the probe 27 fixed on the pedestal 26 contacts the spring electrode 35. Next, the pressure in the pressure chamber 28 is set to a detection pressure value of the pressure switch 25. Then, a laser beam 46 from the laser beam oscillator 21 is irradiated to the diaphragm 11 of the pressure switch 25 to etch it. As a result, the diaphragm 11 is thinned by being etched. When diaphragm 11 is bent turning the pressure switch 25 on, a signal is sent to the control unit 30 to cease the irradiation of the laser beam 46. After adjustment of one pressure switch 25 is completed, the rotary stage 33 is rotated for the adjustment of the next pressure switch 25, whereby the next pressure switch 25 is moved to, the desired position.

In the above-mentioned manner, the trimming method for a pressure switch according to the present invention can adjust accurately the pressure in the pressure switch in a short time and can provide good manufacturing yield.

What is claimed is:

1. A method of adjusting a semiconductor pressure switch to a predetermined pressure detection value, wherein the semiconductor pressure switch comprises a contact electrode supported on a semiconductor pressure-receiving diaphragm which defines part of a pressure cavity, and a reference electrode supported by a support substrate and spaced from the contact electrode within the pressure cavity such that pressure applied to the diaphragm on the external side of the pressure cavity effects inward displacement of the diaphragm to move the contact electrode into contact with the reference electrode to produce an output corresponding to a pressure detection value, the adjusting method comprising the steps of:

(a) mounting and pressurizing the semiconductor pressure switch in a pressure chamber;

(b) measuring the detection pressure at which the semiconductor pressure switch switches to determine if the pressure is above or below a predetermined pressure detection value; and (c) adjusting a thickness of the diaphragm thinning the diaphragm, if the measured pressure is above the predetermined pressure detection value, and thickening the diaphragm, if the measured pressure is below the predetermined pressure detection value, to adjust the measured pressure to the predetermined pressure detection value.

2. A method of adjusting a semiconductor pressure switch according to claim 1; wherein the diaphragm is thinned by etching.

3. A method of adjusting a semiconductor pressure switch according to claim 2; wherein the diaphragm is etched by immersing the silicon substrate in a potassium hydroxide solution.

4. A method of adjusting a semiconductor pressure switch according to claim 2; wherein the diaphragm is etched by irradiating a laser beam onto a portion of the diaphragm while applying a pressure equal to the predetermined pressure detection value.

5. A method of adjusting a semiconductor pressure switch according to claim 1; wherein the diaphragm is thickenned by film forming.

6. A method of adjusting a semiconductor pressure switch according to claim 5; wherein the film forming includes forming polycrystalline silicon on the diaphragm.

7. A method of adjusting a semiconductor pressure switch according to claim 1; wherein the thickness of the diaphragm is adjusted to achieve a predetermined pressure detection value on the order of 2 kg/cm$^2$.

8. A method of adjusting a semiconductor pressure switch according to claim 1; further including the step of monitoring the pressure detection value of the switch while adjusting the thickness of the diaphragm.

9. A method of adjusting a semiconductor detection pressure switch to a predetermined pressure detection value, wherein the semiconductor pressure switch comprises a contact electrode supported on a semiconductor pressure-receiving diaphragm which defines part of a pressure cavity, and a reference electrode supported by a support substrate and spaced from the contact electrode within the pressure cavity such that pressure applied to the diaphragm on the external side of the pressure cavity effects inward displacement of the diaphragm to move the contact electrode into contact with the reference electrode to produce an output corresponding to a pressure detection value, the adjusting method comprising the steps of:

(a) mounting at least one semiconductor pressure switch in a pressure chamber; and (b) adjusting the thickness of the diaphragm at least one semiconductor pressure switch by etching the diaphragm with a laser beam while applying thereto a pressure equal to the predetermined pressure detection value of the switch to make the switch operate at the predetermined pressure detection value.

10. A method of adjusting a semiconductor pressure switch according to claim 9; wherein the at least one semiconductor pressure switch comprises a plurality of semiconductor pressure switches.

11. A method of adjusting a semiconductor pressure switch according to claim 9; further including the step of monitoring the pressure detection value of the switch while etching the diaphragm.

12. A method of manufacturing a semiconductor pressure switch, the manufacturing method comprising the steps of:

(a) etching a silicon substrate on an upper surface thereof to form a recessed portion;

(b) forming a contact electrode on the recessed portion;

(c) forming a reference electrode on a glass substrate;

(d) aligning the glass substrate with the silicon substrate so that the reference electrode is spaced from and faces the contact electrode;

(e) hermetically sealing the silicon substrate to the glass substrate;

(f) etching the silicon substrate on a lower surface thereof to form a diaphragm thereby forming a semiconductor pressure switch;

(g) mounting the semiconductor pressure switch in a pressure chamber; and (h) adjusting the thickness of the diaphragm by irradiating a laser beam onto a portion of the diaphragm while applying a pressure on the diaphragm equal to a predetermined pressure detection value of the switch to make the switch operate at the predetermined pressure detection value.

13. A method of manufacturing a semiconductor pressure switch according to claim 12; wherein the diaphragm is etched to adjust the pressure detection value of the switch to 2 kg/cm$^2$.

14. A method of manufacturing a semiconductor pressure switch according to claim 12; further including the step of monitoring the pressure detection value of the switch while etching the diaphragm.

* * * * *